(12) United States Patent
Lin

(10) Patent No.: US 9,369,097 B2
(45) Date of Patent: Jun. 14, 2016

(54) MULTI-BAND LOW NOISE AMPLIFIER

(71) Applicant: QUALCOMM Incorporated, San Diego, CA (US)

(72) Inventor: Saihua Lin, Santa Clara, CA (US)

(73) Assignee: Qualcomm Incorporated, San Diego, CA (US)

( * ) Notice: Subject to any disclaimer, the term of this patent is extended or adjusted under 35 U.S.C. 154(b) by 11 days.

(21) Appl. No.: 14/478,691

(22) Filed: Sep. 5, 2014

(65) Prior Publication Data
US 2016/0072455 A1    Mar. 10, 2016

(51) Int. Cl.
| | |
|---|---|
| H03F 3/191 | (2006.01) |
| H03F 3/193 | (2006.01) |
| H03F 1/56 | (2006.01) |
| H03F 3/68 | (2006.01) |
| H03F 1/22 | (2006.01) |
| H03F 1/32 | (2006.01) |
| H03F 3/24 | (2006.01) |

(52) U.S. Cl.
CPC ............... *H03F 3/191* (2013.01); *H03F 1/223* (2013.01); *H03F 1/3205* (2013.01); *H03F 1/565* (2013.01); *H03F 3/193* (2013.01); *H03F 3/245* (2013.01); *H03F 3/68* (2013.01); *H03F 2200/111* (2013.01); *H03F 2200/171* (2013.01); *H03F 2200/294* (2013.01); *H03F 2200/387* (2013.01); *H03F 2200/391* (2013.01); *H03F 2200/541* (2013.01)

(58) Field of Classification Search
USPC .................. 330/295, 124 R, 84, 286, 53
See application file for complete search history.

(56) References Cited

U.S. PATENT DOCUMENTS

| | | | |
|---|---|---|---|
| 6,744,320 B2 | 6/2004 | Nguyen et al. | |
| 7,400,203 B2 * | 7/2008 | Ojo ........................... | H03F 1/42 330/260 |
| 7,689,187 B2 | 3/2010 | Galan et al. | |
| 7,990,216 B2 | 8/2011 | Chang et al. | |
| 8,264,281 B1 | 9/2012 | Rajendran et al. | |
| 8,385,877 B2 | 2/2013 | Chang et al. | |
| 9,166,731 B2 | 10/2015 | Chang et al. | |
| 2009/0275304 A1 | 11/2009 | Thomas et al. | |
| 2011/0018635 A1 | 1/2011 | Tasic et al. | |
| 2014/0113578 A1 | 4/2014 | Xu et al. | |
| 2014/0210554 A1 | 7/2014 | Abdelhalem et al. | |
| 2014/0240048 A1 | 8/2014 | Youssef et al. | |

OTHER PUBLICATIONS

International Search Report and Written Opinion—PCT/US2015/046724—ISAEPO—Oct. 29, 2015, 12 pages.

* cited by examiner

*Primary Examiner* — Hieu Nguyen

(74) *Attorney, Agent, or Firm* — Toler Law Group, PC

(57) ABSTRACT

An apparatus includes a first path tuned to a first frequency band and a second path tuned to a second frequency band. The apparatus also includes cross-coupled circuitry having a first input coupled to the first path and a second input coupled to the second path and having a first output coupled to the second path and a second output coupled to the first path.

20 Claims, 6 Drawing Sheets

MULTI-BAND LOW NOISE AMPLIFIER

I. FIELD

The present disclosure is generally related to a multi-band low noise amplifier.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Wireless devices may include multiple low noise amplifiers to receive signals over multiple frequency bands. For example, a first low noise amplifier may be configurable to receive signals over a first frequency band (e.g., a 2.4 Gigahertz (GHz) band), and a second low noise amplifier may be configurable to receive signals over a second frequency band (e.g., a 5.6 GHz band). Using multiple low noise amplifiers for multi-band reception (e.g., dual-band reception) may increase die area. For example, a transistor core for each low noise amplifier may be relatively large (e.g., in the millimeter (mm) range), which may increase the chip size, die area, and cost of the low noise amplifiers. In addition, while Institute of Electrical and Electronics Engineers (IEEE) 802.11 ("WiFi") standards for wireless local area networks (WLANs) may be supported by a first frequency band and a second frequency band, inter-band interference from simultaneously received multi-band signals may decrease throughput for the WLANs.

III. BRIEF DESCRIPTION OF THE DRAWINGS

IV. DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
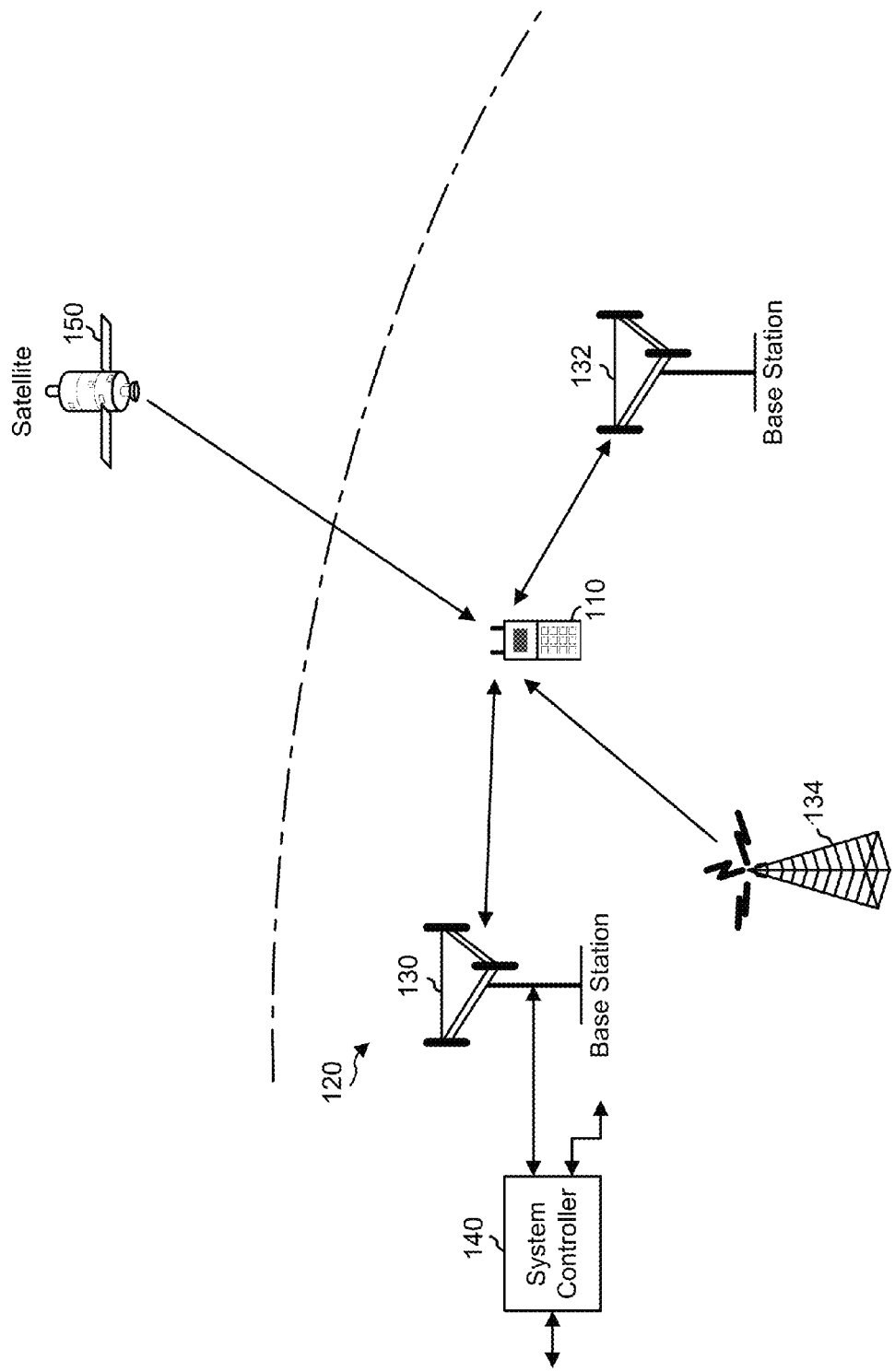
FIG. 1 shows a wireless device communicating with a wireless system.

FIG. 1 shows a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless system may include any number of base stations and any set of network entities.

The wireless device 110 may also be referred to as a user equipment (UE), a mobile station, a terminal, an access terminal, a subscriber unit, a station, etc. The wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. The wireless device 110 may communicate with wireless system 120. The wireless device 110 may also receive signals from broadcast stations (e.g., a broadcast station 134), signals from satellites (e.g., a satellite 150) in one or more global navigation satellite systems (GNSS), etc. The wireless device 110 may support one or more radio technologies for wireless communication such as LTE, WCDMA, CDMA 1X, EVDO, TD-SCDMA, GSM, 802.11, etc.

Figure 2:
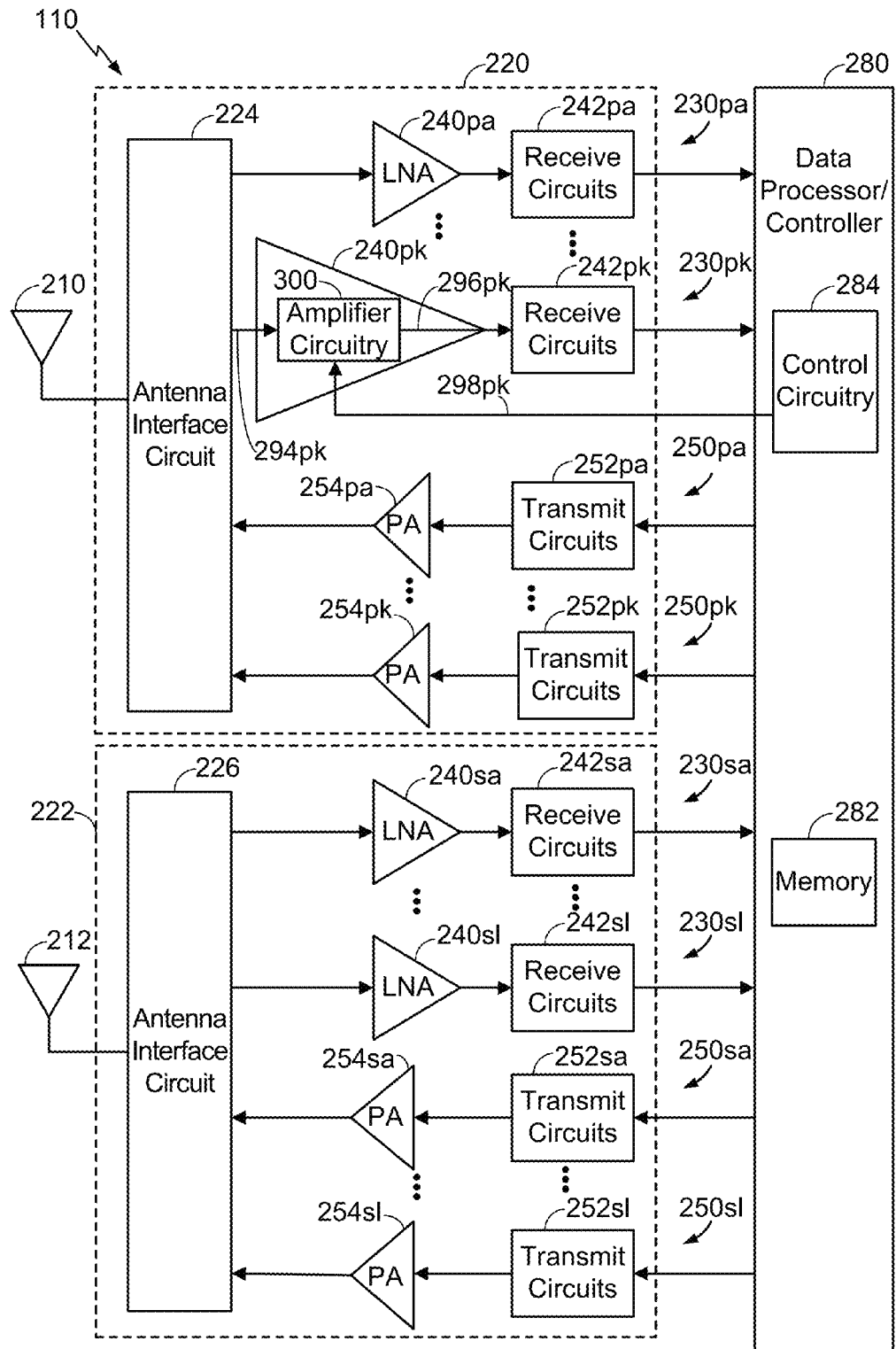
FIG. 2 shows a block diagram of the wireless device in FIG. 1.

FIG. 2 shows a block diagram of an exemplary design of the wireless device 110 in FIG. 1. In this exemplary design, the wireless device 110 includes a transceiver 220 coupled to a primary antenna 210, a transceiver 222 coupled to a secondary antenna 212, and a data processor/controller 280. The transceiver 220 includes multiple (K) receivers 230pa to 230pk and multiple (K) transmitters 250pa to 250pk to support multiple frequency bands, multiple radio technologies, carrier aggregation, etc. The transceiver 222 includes multiple (L) receivers 230sa to 230sl and multiple (L) transmitters 250sa to 250sl to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230pa to 230pk and 230sa to 230sl includes a multi-band LNA 240pa to 240pk and 240sa to 240sl and a receive circuit 242pa to 242pk and 242sa to 242sl, respectively. For data reception, the primary antenna 210 receives signals from base stations and/or other transmitter stations and provides a received RF signal, which is routed through an antenna interface circuit 224 and presented as an input RF signal 294pk to a selected receiver (e.g., the receiver 230pk). In a similar manner, the secondary antenna 212 receives signals from base stations and/or other transmitter stations and provides a received RF signal, which is routed through an antenna interface circuit 226 and presented an input RF signal to a selected receiver.

In an exemplary embodiment, the input RF signal 294*pk* may be a multi-band signal having signal components in a first frequency band (e.g., a 2.4 Gigahertz (GHz) frequency band), signal components in a second frequency band (e.g., a 5.6 GHz frequency band), and/or signal components in a third frequency band (e.g., an 800 Megahertz (MHz) frequency band). The antenna interface circuit 224 may include switches, duplexers, transmit filters, receive filters, matching circuits, etc. The description below assumes that the receiver 230*pk* is the selected receiver. Within the receiver 230*pk*, an LNA 240*pk* amplifies the input RF signal 294*pk* and provides an output RF signal 296*pk*. For example, the LNA 240*pk* may include amplifier circuitry 300, as further described with respect to FIG. 3, to amplify the input RF signal 294*pk*. In another exemplary embodiment, the LNA 240*pk* may include amplifier circuitry 400 (as described with respect to FIG. 4) or amplifier circuitry 500 (as described with respect to FIG. 5).

The receive circuits 242*pk* may downconvert the output RF signal 296*pk* from RF to baseband, amplify and filter the downconverted signal, and provide an analog input signal to the data processor/controller 280. The receive circuits 242*pk* may include mixers, filters, amplifiers, matching circuits, an oscillator, a local oscillator (LO) generator, a phase locked loop (PLL), etc. Each remaining receiver 230*pa*, 230*sa*, 230*sl* in the transceivers 220, 222 may operate in similar manner as the receiver 230*pk*.

In the exemplary design shown in FIG. 2, each transmitter 250*pa* to 250*pk* and 250*sa* to 250*sl* includes a transmit circuit 252*pa* to 252*pk* and 252*sa* to 252*sl* and a power amplifier (PA) 254*pa* to 254*pk* and 254*sa* to 254*sl*, respectively. For data transmission, the data processor/controller 280 processes (e.g., encodes and modulates) data to be transmitted and provides an analog output signal to a selected transmitter. The description below assumes that the transmitter 250*pa* is the selected transmitter. Within transmitter 250*pa*, the transmit circuits 252*pa* amplify, filter, and upconvert the analog output signal from baseband to RF and provide a modulated RF signal. The transmit circuits 252*pa* may include amplifiers, filters, mixers, matching circuits, an oscillator, an LO generator, a PLL, etc. A PA 254*pa* receives and amplifies the modulated RF signal and provides a transmit RF signal having the proper output power level. The transmit RF signal is routed through the antenna interface circuit 224 and transmitted via the primary antenna 210. Each remaining transmitter 250*pk*, 250*sa*, 25*sl* in the transceivers 220, 222 may operate in similar manner as the transmitter 250*pa*.

FIG. 2 shows an exemplary design of receivers 230*pa* to 230*pk* and 230*sa* to 230*sl* and transmitters 250*pa* to 250*pk* and 250*sa* to 250*sl*. A receiver and a transmitter may also include other circuits not shown in FIG. 2, such as filters, matching circuits, etc. All or a portion of the transceivers 220 and 222 may be implemented on one or more analog integrated circuits (ICs), RF ICs (RFICs), mixed-signal ICs, etc. For example, LNAs 240*pa* to 240*pk* and 240*sa* to 240*sl* and receive circuits 242*pa* to 242*pk* and 242*sa* to 242*sl* may be implemented on one module, which may be an RFIC, etc. The circuits in the transceivers 220 and 222 may also be implemented in other manners.

Figure 3:
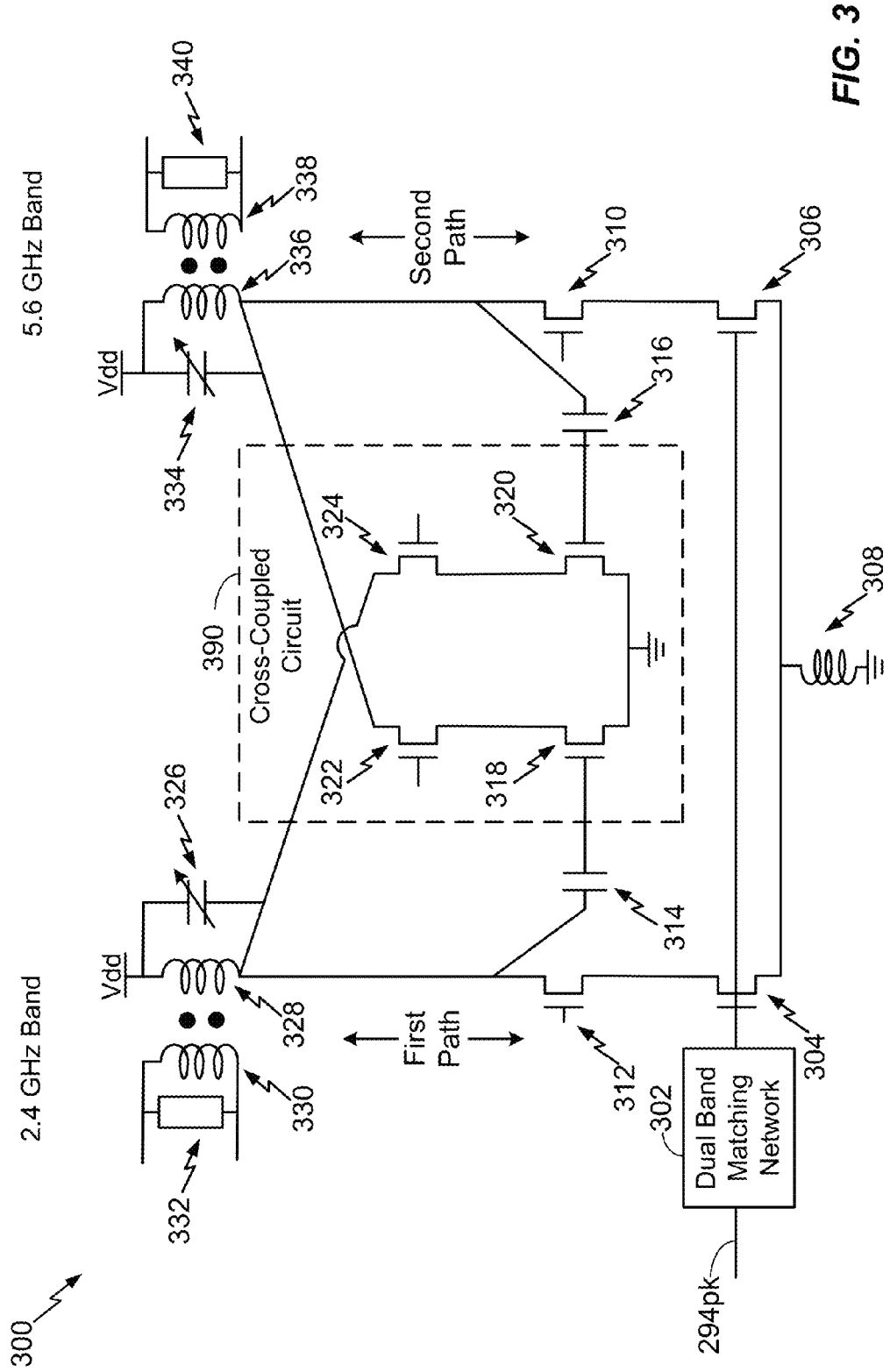
FIG. 3 is a diagram that depicts an exemplary embodiment of a dual-band low noise amplifier.
Figure 4:
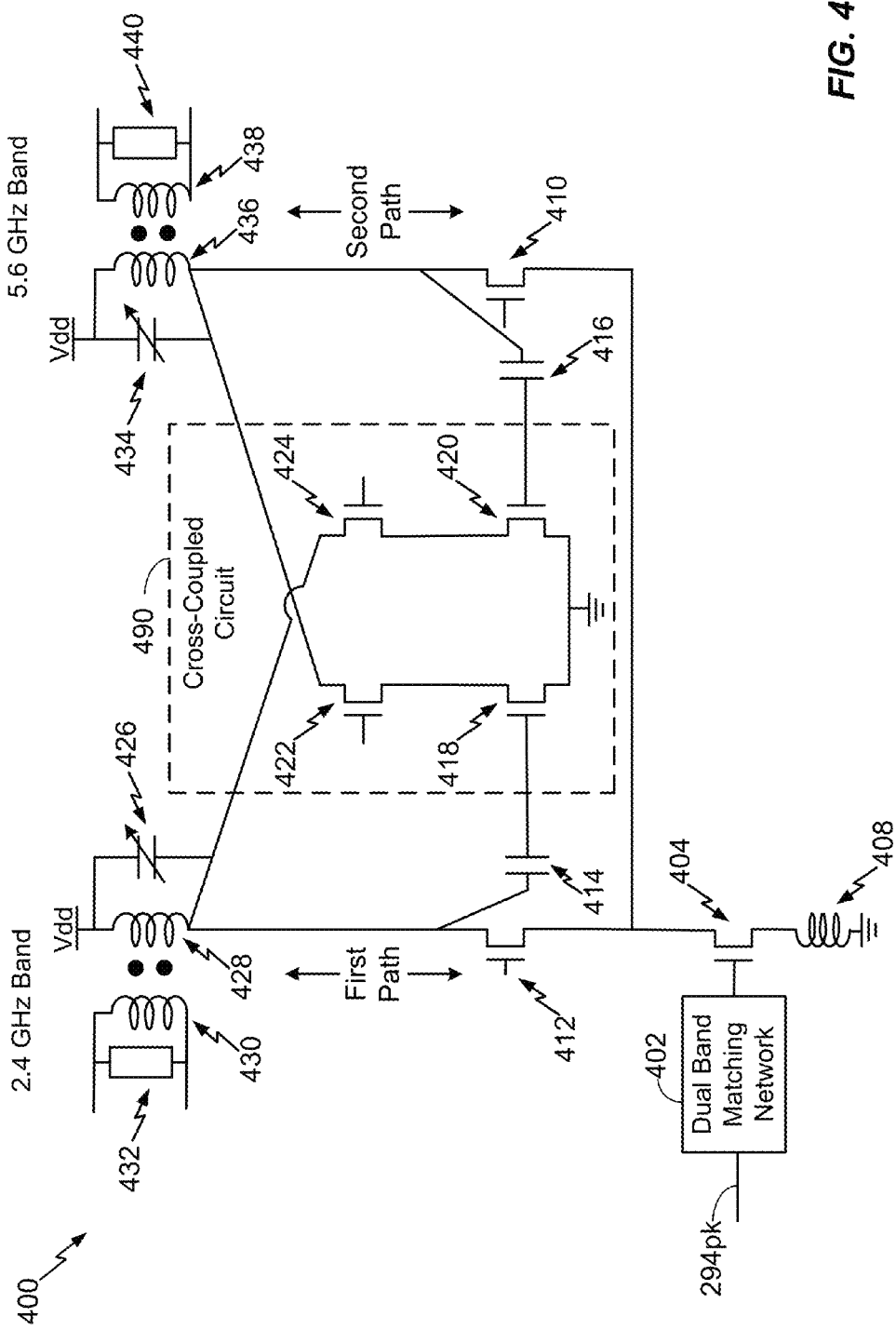
FIG. 4 is a diagram that depicts another exemplary embodiment of a dual-band low noise amplifier.
Figure 5:
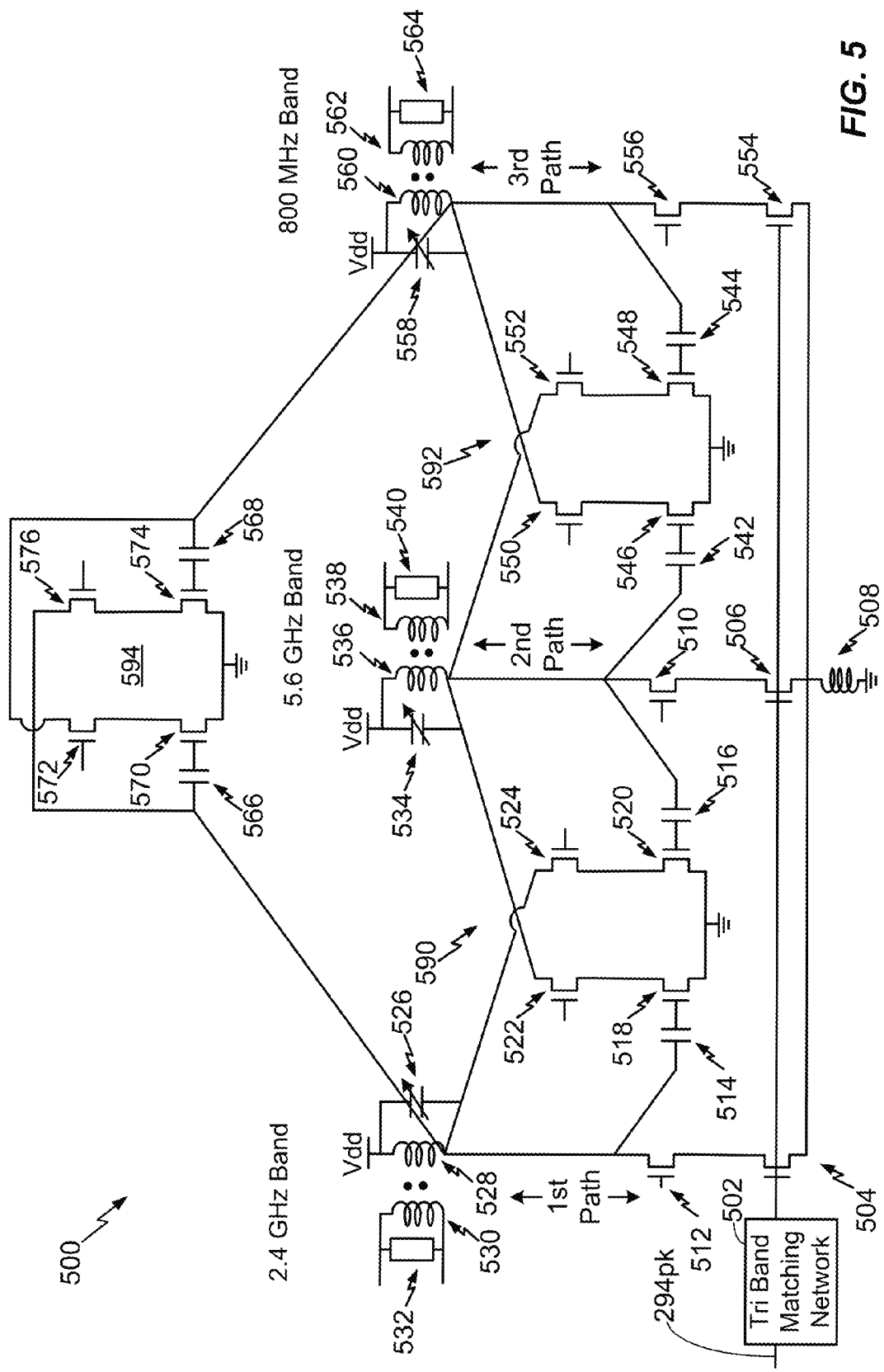
FIG. 5 is a diagram that depicts an exemplary embodiment of a tri-band low noise amplifier.

In an exemplary embodiment, one or more of the multi-band LNAs 240*pa* to 240*pk* and 240*sa* to 240*sl* may receive a control signal (e.g., control signal 298*pk*) from control circuitry 284 in the data processor/controller 280 to operate the corresponding multi-band LNA (e.g., the LNA 240*pk*) in the first frequency band (e.g., the 2.4 GHz frequency band), the second frequency band (e.g., the 5.6 GHz frequency band), the third frequency band (e.g., the 800 MHz frequency band), or a combination thereof in a simultaneous multi-band configuration, as further described with respect to FIGS. 3-5.

The data processor/controller 280 may perform various functions for wireless device 110. For example, the data processor/controller 280 may perform processing for data being received via the receivers 230*pa* to 230*pk* and 230*sa* to 230*sl* and data being transmitted via the transmitters 250*pa* to 250*pk* and 250*sa* to 250*sl*. The data processor/controller 280 may control the operation of the various circuits within transceivers 220 and 222. For example, the data processor/controller 280 may include the control circuitry 284 to operate a multi-band LNA (e.g., the LNA 240*pk*) in the first frequency band (e.g., the 2.4 GHz frequency band), the second frequency band (e.g., the 5.6 GHz frequency band), the third frequency band (e.g., the 800 MHz frequency band), or a combination thereof in a simultaneous multi-band configuration, as further described with respect to FIGS. 3-5. A memory 282 may store program codes and data for data processor/controller 280. Data processor/controller 280 may be implemented on one or more application specific integrated circuits (ASICs) and/or other ICs.

Wireless device 110 may support multiple band groups, multiple radio technologies, and/or multiple antennas. Wireless device 110 may include a number of LNAs to support reception via the multiple band groups, multiple radio technologies, and/or multiple antennas.

Referring to FIG. 3, a diagram of an exemplary embodiment of a dual-band low noise amplifier is shown. FIG. 3 illustrates an exemplary embodiment of the amplifier circuitry 300 in the LNA 240*pk* of FIG. 2.

The amplifier circuitry 300 includes a dual band matching network 302 that is coupled to a transistor 304 and to a transistor 306. An input of the dual band matching network 302 is configured to receive the input RF signal 294*pk* of FIG. 2, and the output of the dual band matching network 302 may be coupled to a gate of the transistor 304 and to a gate of the transistor 306. In an exemplary embodiment, the transistor 304 and the transistor 306 are n-type metal oxide semiconductor (NMOS) transistors. A source of the transistor 304 may be coupled to a first terminal of an inductor 308 (e.g., a degeneration inductor), and a source of the transistor 306 may also be coupled to the first terminal of the inductor 308. A second terminal of the inductor 308 may be coupled to ground. In an exemplary embodiment, the dual band matching network 302 (e.g., an inductive-capacitive (LC) network) and the inductor 308 may provide input impedance matching between the amplifier circuitry 300 and the antenna interface circuit 224 of FIG. 2.

A drain of the transistor 304 may be coupled to a source of a transistor 312 such that the transistors 304, 312 correspond to a pair of cascoded transistors. A drain of the transistor 312 may be coupled to an LC circuit (e.g., an inductor 328 and a tunable capacitor 326) that is tuned to the first frequency band (e.g., the 2.4 GHz frequency band), or that resonates at a frequency within the first frequency band. For example, the drain of the transistor 312 may be coupled to a first terminal of the inductor 328 and to a first terminal of the tunable capacitor 326. A second terminal of the inductor 328 and a second terminal of the tunable capacitor 326 may be coupled to a supply voltage (Vdd) such that the inductor 328 and the tunable capacitor 326 are coupled together in parallel.

In a similar manner, a drain of the transistor 306 may be coupled to a source of a transistor 310 such that the transistors 306, 310 correspond to a pair of cascoded transistors. A drain of the transistor 310 may be coupled to an LC circuit (e.g., an inductor 336 and a tunable capacitor 334) that is tuned to the second frequency band (e.g., the 5.6 GHz frequency band), or that resonates at a frequency within the second frequency band. For example, the drain of the transistor 310 may be coupled to a first terminal of the inductor 336 and to a first terminal of the tunable capacitor 334. A second terminal of the inductor 336 and a second terminal of the tunable capacitor 334 may be coupled to the supply voltage (Vdd) such that the inductor 336 and the tunable capacitor 334 are coupled together in parallel.

The inductance of the inductor 328 and the capacitance of the tunable capacitor 326 may be larger than the inductance of the inductor 336 and the capacitance of the tunable capacitor 334, respectively, such that a first path (that includes transistors 304, 312) is tuned to the first frequency band and a second path (that includes transistors 306, 310) is tuned to the second frequency band. For example, the transistors 304, 312 may be configured to amplify 2.4 GHz signal components of the input RF signal 294pk, and the transistors 306, 310 may be configured to amplify 5.6 GHz components of the input RF signal 294pk.

A first terminal of a capacitor 314 may be coupled to the drain of the transistor 312 (e.g., the capacitor 314 may be coupled to the first path), and a first terminal of a capacitor 316 may be coupled to the drain of the transistor 310 (e.g., the capacitor 316 may be coupled to the second path). A second terminal of the capacitor 314 may be coupled to a cross-coupled circuit 390, and a second terminal of the capacitor 316 may be coupled to the cross-coupled circuit 390. The capacitor 314 may block (or substantially block) direct current (DC) components of a signal along the first path from the cross-coupled circuit 390, and the capacitor 316 may block (or substantially block) DC components of a signal along the second path from the cross-coupled circuit 390.

The cross-coupled circuit 390 may include a transistor 318, a transistor 320, a transistor 322, and a transistor 324. In an exemplary embodiment, the transistors 318-324 are NMOS transistors. A gate of the transistor 318 may be coupled to the second terminal of the capacitor 314, and a gate of the transistor 320 may be coupled to the second terminal of the capacitor 316. A source of the transistor 318 and a source of the transistor 320 may be coupled to ground such that the transistors 318, 320 are common-source transistors.

A drain of the transistor 318 may be coupled to a source of the transistor 322 such that the transistors 318, 322 correspond to a pair of cascoded transistors. A drain of the transistor 322 may be coupled to the first terminal of the tunable capacitor 334 and to the first terminal of the inductor 336 (e.g., coupled to the LC circuit tuned to the 5.6 GHz frequency band). The transistors 318, 322 may be configured to phase-shift and amplify 2.4 GHz signal components to substantially cancel (e.g., destructively interfere with) first signal components (e.g., 2.4 GHz signal components) at the second path. To illustrate, the topology of the transistor 318 (e.g., a common source transistor topology) may shift the phase of the 2.4 GHz signal components by approximately 180 degrees. The phase-shifted 2.4 GHz signal components may be amplified by transistors 318, 322 and provided to the LC circuit 334, 336 to substantially cancel out 2.4 GHz components at the second path (e.g., a 2.4 GHz notch may be created at the LC circuit 334, 336).

A drain of the transistor 320 may be coupled to a source of the transistor 324 such that the transistors 320, 324 correspond to a second pair of cascoded transistors. A drain of the transistor 324 may be coupled to the first terminal of the tunable capacitor 326 and to the first terminal of the inductor 328 (e.g., coupled to the LC circuit 326, 328 tuned to the 2.4 GHz frequency band). The transistors 320, 324 may be configured to phase-shift and amplify 5.6 GHz signal components to substantially cancel (e.g., destructively interfere with) second signal components (e.g., 5.6 GHz signal components) at the first path. To illustrate, the topology of the transistor 320 (e.g., a common source transistor topology) may shift the phase of the 5.6 GHz signal components by approximately 180 degrees. The phase-shifted 5.6 GHz signal components may be amplified by transistors 320, 324 and provided to the LC circuit 328, 326 to substantially cancel out 5.6 GHz components at the first path (e.g., a 5.6 GHz notch may be created at the LC circuit 328, 326).

The inductor 328 (e.g., a primary coil or primary winding) may be electromagnetically coupled to an inductor 330 (e.g., a secondary coil or secondary winding) to form a transformer. For example, the 2.4 GHz signal received by the inductor 328 from the transistors 304, 312 may be "transferred" (e.g., energy transfer via the electromagnetic induction of the inductors 328, 330) from the inductor 328 to the inductor 330. A negative transconductance cell 332 may be coupled in parallel with the inductor 330, and a differential output signal having 2.4 GHz signal components (e.g., a first portion of the output RF signal 296pk) may be generated across the negative transconductance cell 332. Use of the negative transconductance cell 332 may enhance the quality factor of the LC circuit 328, 326.

The inductor 336 (e.g., a primary coil or primary winding) may be electromagnetically coupled to an inductor 338 (e.g., a secondary coil or secondary winding) to form a transformer. For example, the 5.6 GHz signal components that are received at the inductor 336 from the transistors 306, 310 may be "transferred" (e.g., energy transfer via the electromagnetic induction of the inductors 336, 338) from the inductor 336 to the inductor 338. Use of the negative transconductance cell 340 may be coupled in parallel with the inductor 338, and a differential output signal having 5.6 GHz signal components (e.g., a second portion of the output RF signal 296pk) may be generated across the negative transconductance cell 340. Use of the negative transconductance cell 340 may enhance the quality factor of the LC circuit 334, 336.

The amplifier circuitry 300 may substantially cancel interference between 2.4 GHz frequency components and 5.6 GHz frequency components to improve throughput for amplification of a multi-band signal (e.g., the input RF signal 294pk). For example, the cross-coupled circuit 390 (e.g., the transistors 318, 322) may substantially cancel 2.4 GHz signal components at the second path to enable the second path to "isolate" 5.6 GHz signal components, and the cross-coupled circuit 390 (e.g., the transistors 320, 324) may substantially cancel 5.6 GHz signal components at the first path to enable the first path to "isolate" 2.4 GHz signal components. The cancelling effect may be dependent on the phase shift and the amplitude of the two paths (e.g., dependent on the phase shift at the transistors 318, 320 and dependent on the signal amplification at the first path, the second path, and the cross-coupled circuit).

Thus, the amplifier circuitry 300 may reduce inter-band interference between the 2.4 GHz signal components and the 5.6 GHz signal components of the input signal 294pk. Reducing inter-band interference may enhance throughput for systems that comply with Institute of Electrical and Electronic Engineers (IEEE) 802.11 ("WiFi") standards for wireless local area networks (WLANs). For example, interference between 2G WiFi signals (e.g., the 2.4 GHz signal components) and 5G WiFi signals (e.g., the 5.6 GHz signal components) at a low noise amplifier may be reduced.

Referring to FIG. 4, a diagram of another exemplary embodiment of a dual-band low noise amplifier is shown. For example, FIG. 4 illustrates an exemplary embodiment of amplifier circuitry 400. The amplifier circuitry 400 is an alternative embodiment of the amplifier circuitry 300 in the LNA 240*pk* of FIG. 2.

The amplifier circuitry 400 includes a dual band matching network 402 that is coupled to a transistor 404. For example, an input of the dual band matching network 402 is configured to receive the input RF signal 294*pk* of FIG. 2, and the output of the dual band matching network 402 may be coupled to a gate of the transistor 404. In an exemplary embodiment, the transistor 404 is an NMOS transistor. A source of the transistor 404 may be coupled to a first terminal of an inductor 408 (e.g., a degeneration inductor), and a terminal of the inductor 408 may be coupled to ground. In an exemplary embodiment, the dual band matching network 402 (e.g., an inductive-capacitive (LC) network) and the inductor 408 may provide input impedance matching between the amplifier circuitry 400 and the antenna interface circuit 224 of FIG. 2.

A drain of the transistor 404 may be coupled to a source of a transistor 412 and to a source of a transistor 410, such that the transistors 412, 410 are common source transistors. A drain of the transistor 412 may be coupled to an LC circuit (e.g., an inductor 428 and a tunable capacitor 426) that is tuned to the first frequency band (e.g., the 2.4 GHz frequency band). For example, the drain of the transistor 412 may be coupled to a first terminal of the inductor 428 and to a first terminal of the tunable capacitor 426. A second terminal of the inductor 428 and a second terminal of the tunable capacitor 426 may be coupled to a supply voltage (Vdd), such that the inductor 428 and the tunable capacitor 426 are coupled together in parallel. A drain of the transistor 410 may be coupled to an LC circuit (e.g., an inductor 436 and a tunable capacitor 434) that is tuned to the second frequency band (e.g., the 5.6 GHz frequency band). For example, the drain of the transistor 410 may be coupled to a first terminal of the inductor 436 and to a first terminal of the tunable capacitor 434. A second terminal of the inductor 436 and a second terminal of the tunable capacitor 434 may be coupled to the supply voltage (Vdd), such that the inductor 436 and the tunable capacitor 434 are coupled together in parallel.

The inductance of the inductor 428 and the capacitance of the tunable capacitor 426 may be larger than the inductance of the inductor 436 and the capacitance of the tunable capacitor 434, respectively, such that a first path (that includes transistor 412) is tuned to the first frequency band and a second path (that includes transistor 410) is tuned to the second frequency band. For example, the transistors 404, 412 may be configured to amplify 2.4 GHz signal components of the input RF signal 294*pk*, and the transistors 404, 410 may be configured to amplify 5.6 GHz components of the input RF signal 294*pk*.

A first terminal of a capacitor 414 may be coupled to the drain of the transistor 412 (e.g., coupled to the first path), and a first terminal of a capacitor 416 may be coupled to the drain of the transistor 410 (e.g., coupled to the second path). A second terminal of the capacitor 414 may be coupled to a cross-coupled circuit 490, and a second terminal of the capacitor 416 may be coupled to the cross-coupled circuit 490. The capacitor 414 may block (or substantially block) DC components of the first path from the cross-coupled circuit 490, and the capacitor 416 may block (or substantially block) DC components of the second path from the cross-coupled circuit 490.

The cross-coupled circuit 490 may include a transistor 418, a transistor 420, a transistor 422, and a transistor 424. In an exemplary embodiment, the transistors 418-424 are NMOS transistors. A gate of the transistor 418 may be coupled to the second terminal of the capacitor 414, and a gate of the transistor 420 may be coupled to the second terminal of the capacitor 416. A source of the transistor 418 and a source of the transistor 420 may be coupled to ground such that the transistors 418, 420 are common-source transistors.

A drain of the transistor 418 may be coupled to a source of the transistor 422 such that the transistors 418, 422 correspond to a first pair of cascoded transistors. A drain of the transistor 422 may be coupled to the first terminal of the tunable capacitor 434 and to the first terminal of the inductor 436 (e.g., coupled to the LC circuit 434, 436 tuned to the 5.6 GHz frequency band). The transistors 418, 422 may be configured to phase-shift and amplify 2.4 GHz signal components to substantially cancel (e.g., destructively interfere with) first signal components (e.g., 2.4 GHz signal components) at the second path. To illustrate, the topology of the transistor 418 (e.g., a common source transistor topology) may shift the phase of the 2.4 GHz signal components by approximately 180 degrees. The phase-shifted 2.4 GHz signal components may be amplified by transistors 418, 422 and provided to the LC circuit 434, 436 to substantially cancel out 2.4 GHz components at the second path (e.g., a 2.4 GHz notch may be created at the LC circuit 434, 436).

A drain of the transistor 420 may be coupled to a source of the transistor 424 such that the transistors 420, 424 correspond to a second pair of cascoded transistors. A drain of the transistor 424 may be coupled to the first terminal of the tunable capacitor 426 and to the first terminal of the inductor 428 (e.g., coupled to the LC circuit 426, 428 tuned to the 2.4 GHz frequency band). The transistors 420, 424 may be configured to phase-shift and amplify 5.6 GHz signal components to substantially cancel (e.g., destructively interfere with) second signal components (e.g., 5.6 GHz signal components) at the first path. To illustrate, the topology of the transistor 420 (e.g., a common source transistor topology) may shift the phase of the 5.6 GHz signal components by approximately 180 degrees. The phase-shifted 5.6 GHz signal components may be amplified by transistors 420, 424 and provided to the LC circuit 428, 426 to substantially cancel out 5.6 GHz components at the first path (e.g., a 5.6 GHz notch may be created at the LC circuit 428, 426).

The inductor 428 (e.g., a primary coil or primary winding) may be electromagnetically coupled to an inductor 430 (e.g., a secondary coil or secondary winding) to form a transformer. For example, the 2.4 GHz signal components received at the inductor 428 from the transistors 404, 412 may be "transferred" (e.g., energy transfer via the electromagnetic induction of the inductors 428, 430) from the inductor 428 to the inductor 430. A negative transconductance cell 432 may be coupled in parallel with the inductor 430, and a differential output signal having 2.4 GHz signal components (e.g., a first portion of the output RF signal 296*pk*) may be generated across the negative transconductance cell 432. The negative transconductance cell 432 may also enhance the quality factor of the LC circuit 428, 426.

The inductor 436 (e.g., a primary coil or primary winding) may be electromagnetically coupled to an inductor 438 (e.g., a secondary coil or secondary winding) to form a transformer. For example, the 5.6 GHz signal components that are received at the inductor 436 from the transistors 406, 410 may be "transferred" (e.g., energy transfer via the electromagnetic induction of the inductors 436, 438) from the inductor 436 to the inductor 438. A negative transconductance cell 440 may be coupled in parallel with the inductor 438, and a differential output signal having 5.6 GHz signal components (e.g., a second portion of the output RF signal 296*pk*) may be generated across the negative transconductance cell 440. The negative transconductance cell 440 may also enhance the quality factor of the LC circuit 434, 436.

The amplifier circuitry 400 may substantially cancel interference between 2.4 GHz frequency components and 5.6 GHz frequency components in a low noise amplifier to improve throughput for amplification of a multi-band signal (e.g., the input RF signal 294pk). For example, the cross-coupled circuit 490 (e.g., the transistors 418, 422) may substantially cancel 2.4 GHz signal components at the second path to enable the second path to "isolate" 5.6 GHz signal components, and the cross-coupled circuit 490 (e.g., the transistors 420, 424) may substantially cancel 5.6 GHz signal components at the first path to enable the first path to "isolate" 2.4 GHz signal components. The cancelling effect may be dependent on the phase shift and the amplitude of the two paths (e.g., dependent on the phase shift at the transistors 418, 420 and dependent on the signal amplification at the first path, the second path, and the cross-coupled circuit). Thus, the amplifier circuitry 400 may reduce inter-band interference between the 2.4 GHz signal components and the 5.6 GHz signal components. Reducing inter-band interference may enhance throughput for systems that comply with WiFi standards for wireless local area networks (WLANs). For example, interference between 2G WiFi signals and 5G WiFi signals may be reduced.

Referring to FIG. 5, a diagram of an exemplary embodiment of a tri-band low noise amplifier is shown. For example, FIG. 5 illustrates an exemplary embodiment of amplifier circuitry 500. The amplifier circuitry 500 may be an alternative embodiment of the amplifier circuitry 300 in the LNA 240pk of FIG. 2, and the amplifier circuitry 500 may correspond to a tri-band low noise amplifier.

The amplifier circuitry 500 may include a triple band matching network 502 that is coupled to a transistor 504, a transistor 506, and a transistor 554. For example, an input of the triple band matching network 502 is configured to receive the input RF signal 294pk of FIG. 2, and the output of the triple band matching network 502 may be coupled to a gate of the transistor 504, to a gate of the transistor 506, and to a gate of the transistor 554. In an exemplary embodiment, the transistor 504, the transistor 506, and the transistor 554 are NMOS transistors. A source of the transistor 504 may be coupled to a first terminal of an inductor 508 (e.g., a degeneration inductor), a source of the transistor 506 may be coupled to the first terminal of the inductor 508, and a source of the transistor 554 may also be coupled to the first terminal of the inductor 508. A second terminal of the inductor 508 may be coupled to ground. In an exemplary embodiment, the triple band matching network 502 (e.g., an inductive-capacitive (LC) network) and the inductor 508 may provide input impedance matching between the amplifier circuitry 500 and the antenna interface circuit 224 of FIG. 2.

A drain of the transistor 504 may be coupled to a source of a transistor 512 such that the transistors 504, 512 correspond to a pair of cascoded transistors. A drain of the transistor 512 may be coupled to an LC circuit (e.g., an inductor 528 and a tunable capacitor 526) that is tuned to the first frequency band (e.g., the 2.4 GHz frequency band). For example, the drain of the transistor 512 may be coupled to a first terminal of the inductor 528 and to a first terminal of the tunable capacitor 526. A second terminal of the inductor 528 and a second terminal of the tunable capacitor 526 may be coupled to a supply voltage (Vdd) such that the inductor 528 and the tunable capacitor 526 are coupled together in parallel.

A drain of the transistor 506 may be coupled to a source of a transistor 510 such that the transistors 506, 510 correspond to a pair of cascoded transistors. A drain of the transistor 510 may be coupled to an LC circuit (e.g., an inductor 536 and a tunable capacitor 534) that is tuned to the second frequency band (e.g., the 5.6 GHz frequency band). For example, the drain of the transistor 510 may be coupled to a first terminal of the inductor 536 and to a first terminal of the tunable capacitor 534. A second terminal of the inductor 536 and a second terminal of the tunable capacitor 534 may be coupled to the supply voltage (Vdd) such that the inductor 536 and the tunable capacitor 534 are coupled together in parallel.

A drain of the transistor 554 may be coupled to a source of a transistor 556 such that the transistors 554, 556 correspond to a pair of cascoded transistors. A drain of the transistor 556 may be coupled to an LC circuit (e.g., an inductor 560 and a tunable capacitor 558) that is tuned to a third frequency band (e.g., the 800 MHz frequency band). The inductor 560 and the tunable capacitor 558 may be included in a third LC circuit coupled to a third path. The third LC circuit may resonate at a frequency within the third frequency band. The drain of the transistor 556 may be coupled to a first terminal of the inductor 560 and to a first terminal of the tunable capacitor 558. A second terminal of the inductor 560 and a second terminal of the tunable capacitor 558 may be coupled to the supply voltage (Vdd) such that the inductor 560 and the tunable capacitor 558 are coupled together in parallel.

The inductance of the inductor 528 and the capacitance of the tunable capacitor 526 may be larger than the inductance of the inductor 536 and the capacitance of the tunable capacitor 534, respectively, such that a first path (that includes transistors 504, 512) is tuned to the first frequency band and a second path (that includes transistors 506, 510) is tuned to the second frequency band. For example, the transistors 504, 512 may be configured to amplify 2.4 GHz signal components of the input RF signal 294pk, and the transistors 506, 510 may be configured to amplify 5.6 GHz components of the input RF signal 294pk. The inductance of the inductor 560 and the capacitance of the tunable capacitor 558 may be larger than the inductance of the inductor 536 and the capacitance of the tunable capacitor 534, respectively, such that a third path (that includes transistors 554, 556) is tuned to the third frequency band. For example, the transistors 554, 556 may be configured to amplify 800 MHz signal components of the input RF signal 294pk.

A first terminal of a capacitor 514 may be coupled to the drain of the transistor 512 (e.g., coupled to the first path), and a first terminal of a capacitor 516 may be coupled to the drain of the transistor 510 (e.g., coupled to the second path). A second terminal of the capacitor 514 may be coupled to a cross-coupled circuit 590, and a second terminal of the capacitor 516 may be coupled to the cross-coupled circuit 590. The capacitor 514 may block (or substantially block) DC components of the first path from the cross-coupled circuit 590, and the capacitor 516 may block (or substantially block) DC components of the second path from the cross-coupled circuit 590.

A first terminal of a capacitor 542 may be coupled to the drain of the transistor 510 (e.g., coupled to the second path), and a first terminal of the capacitor 544 may be coupled to the drain of the transistor 556 (e.g., coupled to the third path). A second terminal of the capacitor 542 may be coupled to a cross-coupled circuit 592, and a second terminal of the capacitor 544 may be coupled to the second cross-coupled circuit 592. The capacitor 542 may block (or substantially block) DC components of the second path from the cross-coupled circuit 592, and the capacitor 544 may block (or substantially block) DC components of the third path from the cross-coupled circuit 592.

A first terminal of a capacitor 566 may be coupled to the drain of the transistor 512 (e.g., coupled to the first path), and a first terminal of a capacitor 568 may be coupled to the drain of the transistor 556 (e.g., coupled to the third path). A second terminal of the capacitor 566 may be coupled to a cross-coupled circuit 594, and a second terminal of the capacitor 568 may be coupled to the cross-coupled circuit 594. The capacitor 566 may block (or substantially block) DC components of the first path from the cross-coupled circuit 594, and the capacitor 568 may block (or substantially block) DC components of the third path from the cross-coupled circuit 594.

The cross-coupled circuit 590 may include a transistor 518, a transistor 520, a transistor 522, and a transistor 524. In an exemplary embodiment, the transistors 518-524 are NMOS transistors. A gate of the transistor 518 may be coupled to the second terminal of the capacitor 514, and a gate of the transistor 520 may be coupled to the second terminal of the capacitor 516. A source of the transistor 518 and a source of the transistor 520 may be coupled to ground such that the transistors 518, 520 are common-source transistors.

A drain of the transistor 518 may be coupled to a source of the transistor 522 such that the transistors 518, 522 correspond to a pair of cascoded transistors. A drain of the transistor 522 may be coupled to the first terminal of the tunable capacitor 534 and to the first terminal of the inductor 536 (e.g., coupled to the LC circuit 534, 536 tuned to the 5.6 GHz frequency band). The transistors 518, 522 may be configured to phase-shift and amplify 2.4 GHz signal components to substantially cancel (e.g., destructively interfere with) first signal components (e.g., 2.4 GHz signal components) at the second path. To illustrate, the topology of the transistor 518 (e.g., a common source transistor topology) may shift the phase of the 2.4 GHz signal components by approximately 180 degrees. The phase-shifted 2.4 GHz signal components may be amplified by transistors 518, 522 and provided to the LC circuit 534, 536 to substantially cancel out 2.4 GHz components at the second path (e.g., a 2.4 GHz notch may be created at the LC circuit 534, 536).

A drain of the transistor 520 may be coupled to a source of the transistor 524 such that the transistors 520, 524 correspond to a pair of cascoded transistors. A drain of the transistor 524 may be coupled to the first terminal of the tunable capacitor 526 and to the first terminal of the inductor 528 (e.g., coupled to the LC circuit tuned to the 2.4 GHz frequency band). The transistors 520, 524 may be configured to phase-shift and amplify 5.6 GHz signal components to substantially cancel (e.g., destructively interfere with) second signal components (e.g., 5.6 GHz signal components) at the first path. To illustrate, the topology of the transistor 520 (e.g., a common source transistor topology) may shift the phase of the 5.6 GHz signal components by approximately 180 degrees. The phase-shifted 5.6 GHz signal components may be amplified by transistors 520, 524 and provided to the LC circuit 528, 516 to substantially cancel out 5.6 GHz components at the first path (e.g., a 5.6 GHz notch may be created at the LC circuit 528, 526).

The cross-coupled circuit 592 may include a transistor 546, a transistor 548, a transistor 550, and a transistor 552. In an exemplary embodiment, the transistors 546-552 are NMOS transistors. A gate of the transistor 546 may be coupled to the second terminal of the capacitor 542, and a gate of the transistor 548 may be coupled to the second terminal of the capacitor 544. A source of the transistor 546 and a source of the transistor 548 may be coupled to ground such that the transistors 546, 548 are common-source transistors.

A drain of the transistor 546 may be coupled to a source of the transistor 550 such that the transistors 546, 550 correspond to a pair of cascoded transistors. A drain of the transistor 550 may be coupled to the first terminal of the tunable capacitor 560 and to the first terminal of the inductor 558 (e.g., coupled to the LC circuit tuned to the 800 MHz frequency band). The transistors 546, 550 may be configured to phase-shift and amplify 5.6 GHz signal components to substantially cancel (e.g., destructively interfere with) second signal components (e.g., 5.6 GHz signal components) at the third path. To illustrate, the topology of the transistor 546 (e.g., a common source transistor topology) may shift the phase of the 5.6 GHz signal components by approximately 180 degrees. The phase-shifted 5.6 GHz signal components may be amplified by transistors 546, 550 and provided to the LC circuit 558, 569 to substantially cancel out 5.6 GHz components at the third path (e.g., a 5.6 GHz notch may be created at the LC circuit 558, 560).

A drain of the transistor 548 may be coupled to a source of the transistor 552 such that the transistors 548, 552 correspond to a pair of cascoded transistors. A drain of the transistor 552 may be coupled to the first terminal of the tunable capacitor 534 and to the first terminal of the inductor 536 (e.g., coupled to the LC circuit tuned to the 5.6 GHz frequency band). The transistors 548, 552 may be configured to phase-shift and amplify 800 MHz signal components to substantially cancel (e.g., destructively interfere with) third signal components (e.g., 800 MHz signal components) at the second path. To illustrate, the topology of the transistor 548 (e.g., a common source transistor topology) may shift the phase of the 800 MHz signal components by approximately 180 degrees. The phase-shifted 800 MHz signal components may be amplified by transistors 548, 552 and provided to the LC circuit 534, 536 to substantially cancel out 800 MHz components at the second path (e.g., an 800 MHZ notch may be created at the LC circuit 534, 536).

The cross-coupled circuit 594 may include a transistor 570, a transistor 574, a transistor 572, and a transistor 576. In an exemplary embodiment, the transistors 570-576 are NMOS transistors. A gate of the transistor 570 may be coupled to the second terminal of the capacitor 566, and a gate of the transistor 574 may be coupled to the second terminal of the capacitor 568. A source of the transistor 570 and a source of the transistor 574 may be coupled to ground such that the transistors 570, 574 are common-source transistors.

A drain of the transistor 570 may be coupled to a source of the transistor 572 such that the transistors 570, 572 correspond to a pair of cascoded transistors. A drain of the transistor 572 may be coupled to the first terminal of the tunable capacitor 558 and to the first terminal of the inductor 560 (e.g., coupled to the LC circuit tuned to the 800 MHz frequency band). The transistors 570, 572 may be configured to phase-shift and amplify 2.4 GHz signal components to substantially cancel (e.g., destructively interfere with) first signal components (e.g., 2.4 GHz signal components) at the third path. To illustrate, the topology of the transistor 570 (e.g., a common source transistor topology) may shift the phase of the 2.4 GHz signal components by approximately 180 degrees. The phase-shifted 2.4 GHz signal components may be amplified by transistors 570, 572 and provided to the LC circuit 558, 560 to substantially cancel out 2.4 GHz components at the third path (e.g., a 2.4 GHz notch may be created at the LC circuit 558, 560).

A drain of the transistor 574 may be coupled to a source of the transistor 576 such that the transistors 574, 576 correspond to a pair of cascoded transistors. A drain of the transistor 576 may be coupled to the first terminal of the tunable capacitor 526 and to the first terminal of the inductor 528 (e.g., coupled to the LC circuit tuned to the 2.4 GHz frequency band). The transistors 574, 576 may be configured to phase-shift and amplify 800 MHz signal components to substantially cancel (e.g., destructively interfere with) third signal components (e.g., 800 MHz signal components) at the first path. To illustrate, the topology of the transistor 574 (e.g., a common source transistor topology) may shift the phase of the 800 MHz signal components by approximately 180 degrees. The phase-shifted 800 MHz signal components may be amplified by transistors 574, 576 and provided to the LC circuit 528, 526 to substantially cancel out 800 MHz components at the first path (e.g., an 800 MHZ notch may be created at the LC circuit 528, 526).

The inductor 528 (e.g., a primary coil or primary winding) may be electromagnetically coupled to an inductor 530 (e.g., a secondary coil or secondary winding) to form a transformer. For example, the 2.4 GHz signal components that are received at the inductor 528 from the transistors 504, 512 may be "transferred" (e.g., energy transfer via the electromagnetic induction of the inductors 528, 530) from the inductor 528 to the inductor 530. A negative transconductance cell 532 may be coupled in parallel with the inductor 530, and a differential output signal having 2.4 GHz signal components (e.g., a portion of the output RF signal 296pk) may be generated across the negative transconductance cell 532. The negative transconductance cell 532 may also enhance the quality factor of the LC circuit 528, 526.

The inductor 536 (e.g., a primary coil or primary winding) may be electromagnetically coupled to an inductor 538 (e.g., a secondary coil or secondary winding) to form a transformer. For example, the 5.6 GHz signal components that are received by the inductor 536 from the transistors 506, 510 may be "transferred" (e.g., energy transfer via the electromagnetic induction of the inductors 536, 538) from the inductor 536 to the inductor 538. A negative transconductance cell 540 may be coupled in parallel with the inductor 538, and a differential output signal having 5.6 GHz signal components (e.g., a portion of the output RF signal 296pk) may be generated across the negative transconductance cell 540. The negative transconductance cell 540 may also enhance the quality factor of the LC circuit 534, 536.

The inductor 560 (e.g., a primary coil or primary winding) may be electromagnetically coupled to an inductor 562 (e.g., a secondary coil or secondary winding) to form a transformer. For example, the 800 MHz signal components that are received by the inductor 560 from the transistors 554, 556 may be "transferred" (e.g., energy transfer via the electromagnetic induction of the inductors 560, 562) from the inductor 560 to the inductor 562. A negative transconductance cell 564 may be coupled in parallel with the inductor 562, and a differential output signal having 800 MHz signal components (e.g., a portion of the output RF signal 296pk) may be generated across the negative transconductance cell 564. The negative transconductance cell 564 may also enhance the quality factor of the LC circuit 558, 560.

Thus, the amplifier circuitry 500 may reduce inter-band interference between the 800 MHz components, the 2.4 GHz signal components, and the 5.6 GHz signal components. Reducing inter-band interference may enhance throughput for systems that comply with WiFi standards for WLANs. For example, interference between cellular signals, 2G WiFi signals and 5G WiFi signals may be reduced. The amplifier circuitry 500 may also reduce interference between the first frequency band (e.g., the 2.4 GHz frequency band) and the third frequency band (e.g., the 800 MHz frequency band) to enhance throughput for a wide area network (WAN).

Figure 6:
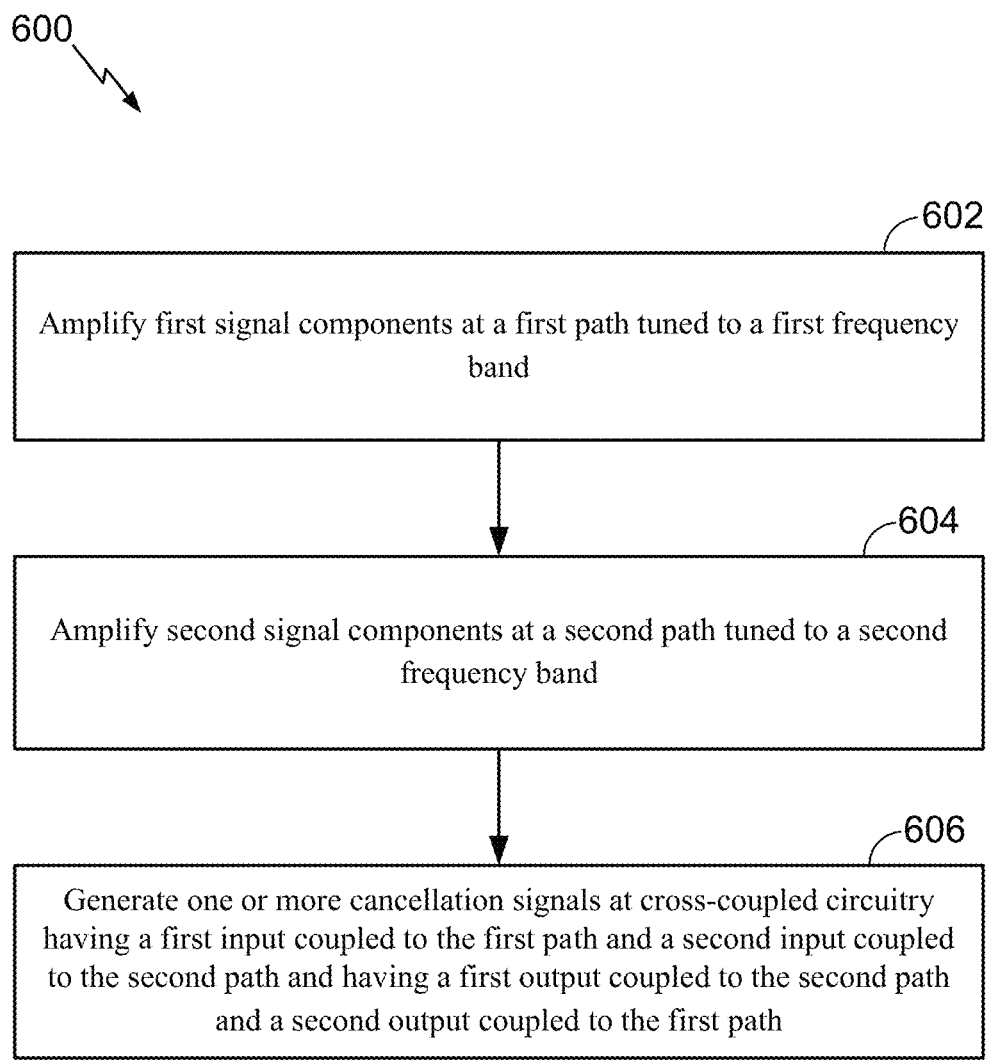
FIG. 6 is a flowchart that illustrates an exemplary embodiment of a method of operating a multi-band low noise amplifier.

Referring to FIG. 6, a flowchart illustrates an exemplary embodiment of a method 600 of operating a multi-band low noise amplifier. In an exemplary embodiment, the method 600 may be performed using the wireless device 110 of FIGS. 1-2, the multi-band low noise amplifier 240pk of FIG. 2, the amplifier circuitry 300 of FIGS. 2-3, the amplifier circuitry 400 of FIG. 4, the amplifier circuitry 500 of FIG. 5, or combinations thereof.

The method 600 includes amplifying first signal components at a first path tuned to a first frequency band, at 602. For example, referring to FIG. 3, the inductance of the inductor 328 and the capacitance of the tunable capacitor 326 may tune the first path to the first frequency band (e.g., the 2.4 GHz frequency band). Thus, the transistors 304, 312 of the first path (which is tuned to the first frequency band) may amplify first signal components (e.g., 2.4 GHz signal components) of the input RF signal 294pk.

Second signal components at a second path tuned to a second frequency band may be amplified, at 604. For example, referring to FIG. 3, the inductance of the inductor 336 and the capacitance of the tunable capacitor 334 may tune the second path to the second frequency band (e.g., the 5.6 GHz frequency band). Thus, the transistors 306, 310 of the second path (which is tuned to the second frequency band) may amplify second signal components (e.g., 5.6 GHz signal components) of the input RF signal 294pk.

One or more cancellation signals may be generated at cross-coupled circuitry, at 606. For example, referring to FIG. 3, the transistors 318, 322 of the cross-coupled circuit 390 may phase-shift and amplify 2.4 GHz signal components at the second path. To illustrate, the topology of the transistor 318 (e.g., a common source transistor topology) may shift the phase of the 2.4 GHz signal components by approximately 180 degrees. The phase-shifted 2.4 GHz signal components may be amplified by transistors 318, 322 and provided to the LC circuit 334, 336 to substantially cancel out 2.4 GHz components at the second path (e.g., a 2.4 GHz notch may be created at the LC circuit 334, 336). Additionally, the transistors 320, 324 of the cross-coupled circuit 390 may phase-shift and amplify 5.6 GHz signal components to substantially cancel (e.g., destructively interfere with) second signal components (e.g., 5.6 GHz signal components) at the first path. To illustrate, the topology of the transistor 320 (e.g., a common source transistor topology) may shift the phase of the 5.6 GHz signal components by approximately 180 degrees. The phase-shifted 5.6 GHz signal components may be amplified by transistors 320, 324 and provided to the LC circuit 328, 326 to substantially cancel out 5.6 GHz components at the first path (e.g., a 5.6 GHz notch may be created at the LC circuit 328, 326).

The method 600 of FIG. 6 may substantially cancel interference between 2.4 GHz frequency components and 5.6 GHz frequency components to improve amplifier throughput for a multi-band signal (e.g., the input RF signal 294pk). For example, the cross-coupled circuit 390 (e.g., the transistors 318, 322) may substantially cancel 2.4 GHz signal components at the second path to enable the second path to "isolate" 5.6 GHz signal components, and the cross-coupled circuit 390 (e.g., the transistors 320, 324) may substantially cancel 5.6 GHz signal components at the first path to enable the first path to "isolate" 2.4 GHz signal components. The cancelling effect may be dependent on the phase shift and the amplitude of the two paths (e.g., dependent on the phase shift at the transistors 318, 320 and dependent on the signal amplification at the first path, the second path, and the cross-coupled circuit).

Thus, the method 600 may reduce inter-band interference between the 2.4 GHz signal components and the 5.6 GHz signal components. Reducing inter-band interference may enhance throughput for systems that comply with WiFi standards for WLANs. For example, interference between 2G WiFi signals (e.g., the 2.4 GHz signal components) and 5G WiFi signals (e.g., the 5.6 GHz signal components) may be reduced.

In conjunction with the described embodiments, an apparatus includes means for amplifying first signal components. The means for amplifying the first signal components may be tuned to a first frequency band. For example, the means for amplifying the first signal components may include the first path of FIG. 3, the first path of FIG. 4, the first path of FIG. 5, one or more other devices, circuits, or any combination thereof.

The apparatus may also include means for amplifying second signal components. The means for amplifying the second signal components may be tuned to a second frequency band. For example, the means for amplifying the second signal components may include the second path of FIG. 3, the second path of FIG. 4, the second path of FIG. 5, one or more other devices, circuits, or any combination thereof.

The apparatus may also include means for generating one or more cancellation signals. The means for generating the one or more cancellation signals have a first input coupled to the means for amplifying the first signal components and a second input coupled to the means for amplifying the second signal components. The means for generating the one or more cancellation signals may also have a first output coupled to the means for amplifying the second signal components and a second output coupled to the means for amplifying the first signal components. For example, the means for generating the one or more cancellation signals may include the cross-coupled circuit 390 of FIG. 3, the cross-coupled circuit 490 of FIG. 4, the transistor 418 of FIG. 5, the transistor 520 of FIG. 5, the transistor 522 of FIG. 5, the transistor 524 of FIG. 5, one or more other devices, circuits, or any combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
a first path tuned to a first frequency band;
a second path tuned to a second frequency band; and
cross-coupled circuitry having a first input coupled to the first path and a second input coupled to the second path and having a first output coupled to the second path and a second output coupled to the first path, wherein the cross-coupled circuitry comprises:
a first set of transistors, a first transistor of the first set of transistors having a gate coupled led to the first path and a second transistor of the first set of transistors having a drain coupled to the second path; and
a second set of transistors, a first transistor of the second set of transistors having a gate coupled to the second path and a second transistor of the second set of transistors having a drain coupled to the first path.

2. The apparatus of claim 1, wherein the first path, the second path, and the cross-coupled circuitry are included in a low noise amplifier.

3. The apparatus of claim 1, wherein the first transistor of the first set of transistors and the first transistor of the second set of transistors are common source transistors.

4. The apparatus of claim 1, wherein the first frequency band is a 2.4 Gigahertz (GHz) frequency band, and wherein the second frequency band is a 5.6 GHz frequency band.

5. The apparatus of claim 1, further comprising a first inductive-capacitive (LC) circuit coupled to the first path, wherein the first LC circuit resonates at a frequency within the first frequency band.

6. The apparatus of claim 5, wherein a first inductor of the first LC circuit is included in a first transformer.

7. The apparatus of claim 1, further comprising a second inductive-capacitive (LC) circuit coupled to the second path, wherein the second LC circuit resonates at a frequency within the second frequency band.

8. The apparatus of claim 7, wherein a second inductor of the second LC circuit is included in a second transformer.

9. The apparatus of claim 1, further comprising:
a third path tuned to a third frequency band;
second cross-coupled circuitry having a first input coupled to the second path and a second input coupled to the third path and having a first output coupled to the third path and a second output coupled to the second path; and
third cross-coupled circuitry having a first input coupled to the first path and a second input coupled to the third path and having a first output coupled to the third path and a second output coupled to the first path.

10. The apparatus of claim 9, wherein the third frequency band is an 800 Megahertz (MHz) frequency band.

11. The apparatus of claim 9, further comprising a third inductive-capacitive (LC) circuit coupled to the third path, wherein the third LC circuit resonates at a frequency within the third frequency band.

12. The apparatus of claim 1, wherein the first frequency band and the second frequency band comply with an Institute of Electrical and Electronics Engineers (IEEE) 802.11 standard.

13. The apparatus of claim 1, further comprising:
a transistor having a drain coupled to the first path and coupled to the second path; and
a dual band matching network having an input configured to receive a radiofrequency (RF) signal and an output coupled to a gate of the transistor.

14. The apparatus of claim 1, further comprising:
a first transistor having a drain coupled to the first path;
a second transistor having a drain coupled to the second path; and
a dual band matching network having an input configured to receive a radiofrequency (RF) signal and an output coupled to a gate of the first transistor and to a gate of the second transistor.

15. The apparatus of claim 1, wherein the first transistor of the first set of transistors is configured to receive a signal and to phase shift the signal by approximately 180 degrees.

16. An apparatus comprising:
means for amplifying first signal components, wherein the means for amplifying the first signal components is tuned to a first frequency band;
means for amplifying second signal components, wherein the means for amplifying the second signal components is tuned to a second frequency band; and
means for generating one or more cancellation signals having a first input coupled to the means for amplifying the first signal components and a second input coupled to the means for amplifying the second signal components and having a first output coupled to the means for amplifying the second signal components and a second output coupled to the means for amplifying the first signal components, the means for generating comprising:
first means for amplifying signals having a gate coupled to the means for amplifying the first signal components and second means for amplifying signals having a drain coupled to the means for amplifying the second signal components; and
third means for amplifying signals having a gate coupled to the means for amplifying the second signal components and fourth means for amplifying signals having a drain coupled to the means for amplifying the first signal components.

17. The apparatus of claim 16, wherein the means for amplifying the first signal components, the means for amplifying the second signal components, and the means for generating one or more cancellation signals are included in a low noise amplifier.

18. The apparatus of claim 16, wherein the first frequency band is a 2.4 Gigahertz (GHz) frequency band, and wherein the second frequency band is a 5.6 GHz frequency band.

19. A method comprising:
amplifying first signal components at a first path tuned to a first frequency band;
amplifying second signal components at a second path tuned to a second frequency band; and
generating one or more cancellation signals at cross-coupled circuitry having a first input coupled to the first path and a second input coupled to the second path and having a first output coupled to the second path and a second output coupled to the first path, wherein the cross-coupled circuitry comprises:
a first set of transistors, a first transistor of the first set of transistors having a gate coupled to the first path and a second transistor of the first set of transistors having a drain coupled to the second path; and
a second set of transistors, a first transistor of the second set of transistors having a gate coupled to the second path and a second transistor of the second set of transistors having a drain coupled to the first path.

20. The method of claim 19, wherein the first frequency band is a 2.4 Gigahertz (GHz) frequency band, and wherein the second frequency band is a 5.6 GHz frequency band.

* * * * *